United States Patent
Pham et al.

(10) Patent No.: US 8,728,885 B1
(45) Date of Patent: May 20, 2014

(54) METHODS OF FORMING A THREE-DIMENSIONAL SEMICONDUCTOR DEVICE WITH A NANOWIRE CHANNEL STRUCTURE

(71) Applicant: GLOBALFOUNDRIES Inc., Grand Cayman (KY)

(72) Inventors: Daniel T. Pham, Clifton Park, NY (US); Jody Fronheiser, Delmar, NY (US); William J. Taylor, Jr., Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/728,438

(22) Filed: Dec. 27, 2012

(51) Int. Cl.
*H01L 29/94* (2006.01)

(52) U.S. Cl.
USPC .................. 438/176; 438/283; 257/E21.623

(58) Field of Classification Search
USPC .......... 438/157, 176, 206, 283; 257/E21.623, 257/E21.637
See application file for complete search history.

(56) References Cited

U.S. PATENT DOCUMENTS

| | | | |
|---|---|---|---|
| 7,235,436 B1 | 6/2007 | Lin et al. | |
| 8,076,231 B2 | 12/2011 | Saitoh et al. | |
| 8,159,018 B2 | 4/2012 | Akil et al. | |
| 2010/0155827 A1* | 6/2010 | Kim et al. | 257/327 |
| 2011/0084336 A1* | 4/2011 | Luning et al. | 257/347 |
| 2011/0097881 A1 | 4/2011 | Vandervorst et al. | |
| 2012/0037994 A1 | 2/2012 | Saitoh et al. | |

* cited by examiner

*Primary Examiner* — Thanhha Pham
(74) *Attorney, Agent, or Firm* — Amerson Law Firm, PLLC

(57) ABSTRACT

One method herein includes forming a plurality of spaced-apart trenches that extend at least partially into a semiconducting substrate, wherein the trenches define a fin structure comprised of first and second layers of semiconducting material, wherein the first layer of semiconducting material is selectively etchable relative to the substrate and the second layer of semiconducting material, forming a sacrificial gate structure above the fin, wherein the gate structure includes a gate insulation layer and a gate electrode, forming a sidewall spacer adjacent the gate structure, performing an etching process to remove the sacrificial gate structure, thereby defining a gate cavity, performing at least one selective etching process to selectively remove the first layer of semiconducting material relative to the second layer of semiconducting material within the gate cavity, thereby defining a space between the second semiconducting material and the substrate, and forming a final gate structure in the gate cavity.

24 Claims, 9 Drawing Sheets

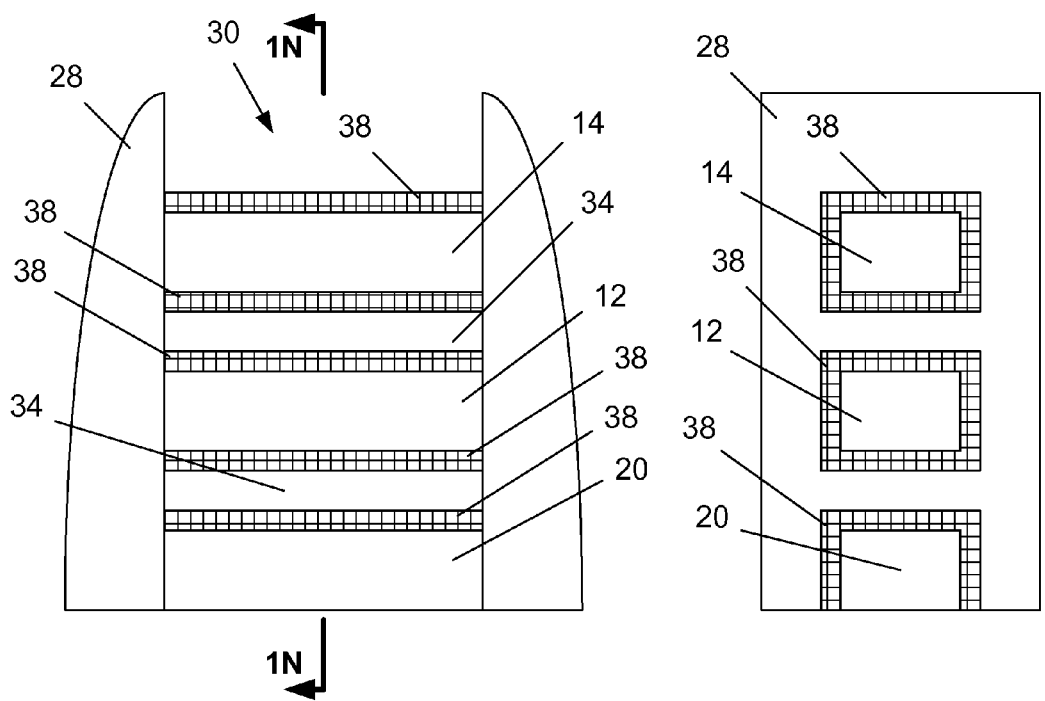
Figure 1M
Figure 1N
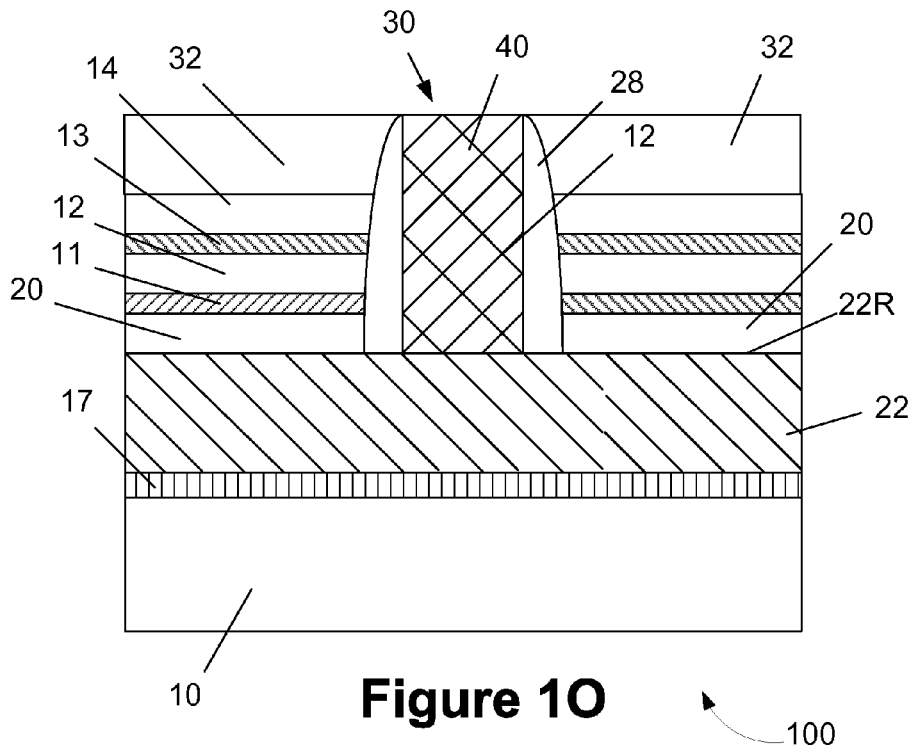
Figure 1O

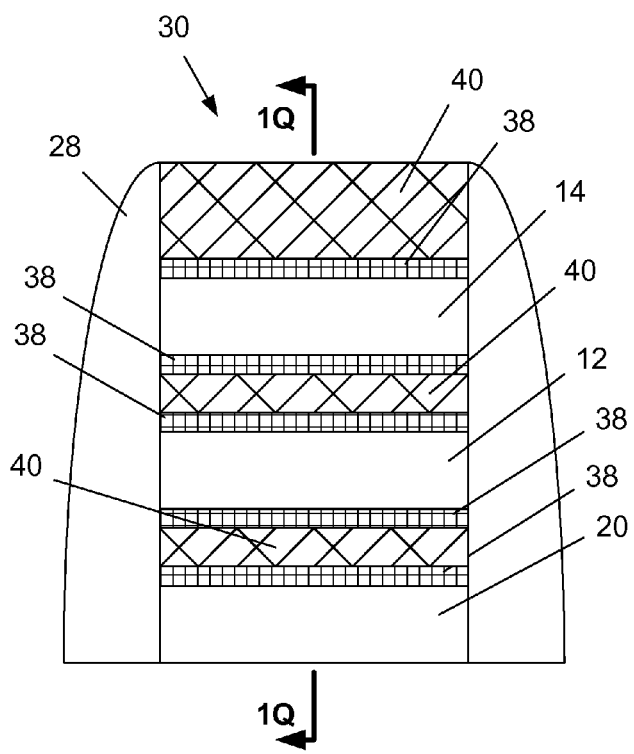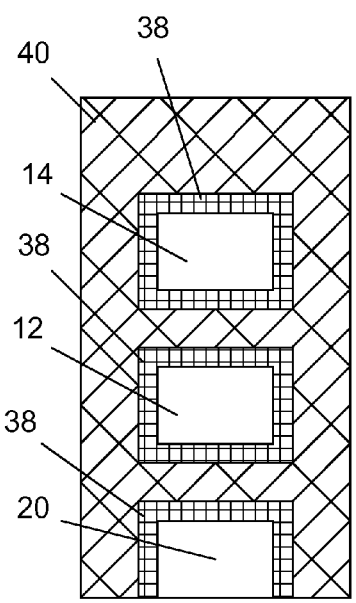
Figure 1P
Figure 1Q

METHODS OF FORMING A THREE-DIMENSIONAL SEMICONDUCTOR DEVICE WITH A NANOWIRE CHANNEL STRUCTURE

BACKGROUND OF THE INVENTION

1. Field of the Invention

Generally, the present disclosure relates to the manufacture of sophisticated semiconductor devices, and, more specifically, to various methods of forming a three-dimensional (3D) semiconductor device, such as, for example, a stressed enhanced performance nanowire semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

Device manufacturers are under constant pressure to produce integrated circuit products with increased performance and lower production cost relative to previous device generations. Thus, device designers spend a great amount of time an effort to maximize device performance while seeking ways to reduce manufacturing cost and improve manufacturing reliability. As it relates to 3D devices, device designers have spent many years and employed a variety of techniques in an effort to improve the performance capability and reliability of such devices.

The present disclosure is directed to various methods of forming a three-dimensional (3D) semiconductor device with a nanowire channel structure.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a three-dimensional (3D) semiconductor device with a nanowire channel structure. In one example, the method includes forming a plurality of spaced-apart trenches that extend at least partially into a semiconducting substrate, wherein the trenches define a fin structure for the device comprised of first and second layers of semiconducting material, wherein the first layer of semiconducting material is selectively etchable relative to the substrate and the second layer of semiconducting material, forming a sacrificial gate structure above the fin, wherein the sacrificial gate structure includes a sacrificial gate insulation layer and a sacrificial gate electrode, forming at least one sidewall spacer adjacent the sacrificial gate structure, performing at least one etching process to remove the sacrificial gate structure and thereby define a gate cavity, performing at least one selective etching process to selectively remove the first layer of semiconducting material relative to the second layer of semiconducting material within the gate cavity and thereby define a space between the second semiconducting material and the substrate and forming a final gate structure in the gate cavity. In some cases, the trenches may be filled with highly stressed dielectric materials to isolate the fins and induce an appropriate stress in the fins to increase device performance capability.

Another illustrative method includes forming a layer of silicon/germanium on a semiconducting substrate comprised of silicon, forming a layer of silicon on the layer of silicon/germanium, performing at least one etching process to form a plurality of spaced-apart trenches, wherein the trenches define a fin structure for the device comprised of the substrate, the layer of silicon/germanium formed above the substrate and the layer of silicon, and forming a sacrificial gate structure above the fin, wherein the sacrificial gate structure is comprised of a sacrificial gate insulation layer and a sacrificial gate electrode. In this embodiment, the method further includes the steps of forming at least one sidewall spacer adjacent the sacrificial gate structure, performing at least one etching process to remove the sacrificial gate structure and thereby define a gate cavity, performing at least one selective etching process to selectively remove the layer of silicon/germanium relative to the layer of silicon within the gate cavity and thereby define a space between the layer of silicon and the substrate, forming a high-k gate insulation layer around an entire exterior surface of the layer of silicon within the gate cavity and forming a gate electrode comprised of a metal on an entire exterior surface of the high-k gate insulation layer. In some cases, the trenches may be filled with a highly stressed (either tensile or compressive depending upon the application) dielectric material, such as silicon nitride, to isolate the fins and induce the appropriate stress in the fins to increase device performance capability.

BRIEF DESCRIPTION OF THE DRAWINGS

The disclosure may be understood by reference to the following description taken in conjunction with the accompanying drawings, in which like reference numerals identify like elements, and in which.

Figure 1A:
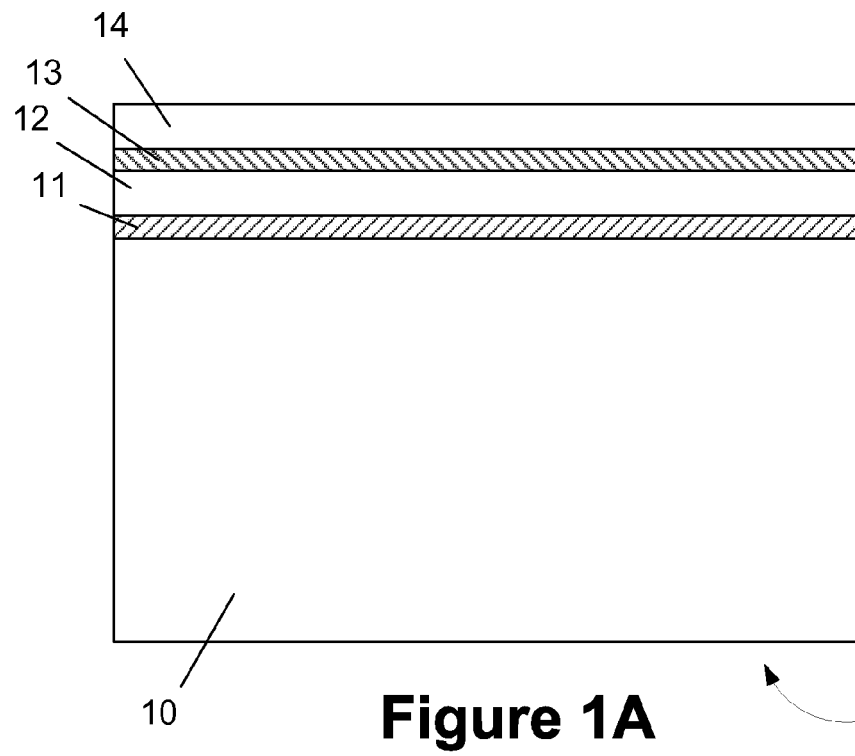
FIGS. 1A-1Q depict one illustrative method disclosed herein of forming a three-dimensional (3D) semiconductor device, such as, for example, a device with a stressed nanowire channel structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a three-dimensional (3D) semiconductor device, such as, for example, a device with a nanowire channel structure. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative nanowire device structure 100 at an early stage of manufacturing that is formed above a semiconducting substrate 10. In the depicted example, the nanowire device structure 100 will be disclosed in the context of using FinFET formation techniques to form the nanowire device 100. However, the present invention should not be considered to be limited to the illustrative examples depicted herein. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all semiconductor structures. The substrate 10 may also be made of materials other than silicon. An illustrative trench isolation structure (not shown) may be formed in the substrate 10 to define an active region where the device 100 will be formed. Of course, as will be recognized by those skilled in the art after a complete reading of the present application, the isolation structure can be formed before or after various fins (described below) are formed in the substrate 10.

In general, the present disclosure is directed to forming a 3D device wherein the channel structure is comprised of one or more nanowires. In the example described herein, the channel structure of the device 100 is depicted as being comprised of two illustrative nanowires. However, after a complete reading of the present application, those skilled in the art will appreciate that the channel structure may be comprised of any desired number of such nanowire structures and in some cases may be comprised of only a single nanowire structure. Thus, the inventions disclosed herein should not be considered as being limited to a device with any particular number of such nanowire structures.

At the point of fabrication depicted in FIG. 1A, various layers of semiconducting material 11, 12, 13 and 14 are formed above the substrate 10. In general, in the depicted example, the layers 11 and 13 are comprised of a semiconductor material that may be selectively removed or etched relative to the materials used for the semiconducting material layers 12 and 14. As described more fully below, in the channel region of the device 100, portions of the semiconductor material layers 11 and 13 will be removed while the semiconducting material layers 12 and 14 are left in place. Thus, the portions of the semiconducting material layers 11 and 13 within the channel region of the device are sacrificial in nature. The semiconductor materials 11, 12, 13 and 14 may be comprised of a variety of different materials such as, for example, silicon, a doped silicon, silicon/germanium, a III-V material, germanium, etc., and they may be formed to any desired thickness using any acceptable process, e.g., an epitaxial growth process, deposition plus ion implantation, etc. In one illustrative embodiment, the semiconducting material layers 11 and 13 are comprised of silicon/germanium with a thickness of about 6-20 nm, while the semiconducting material layers 12 and 14 are comprised of silicon with a thickness of about 20-50 nm. Of course, the layers 11 and 13 need not be made of the same semiconducting material and they need not both have the same thickness. Similarly, the layers 12 and 14 need not be made of the same semiconducting material and they need not have the same thickness.

Figure 1B:
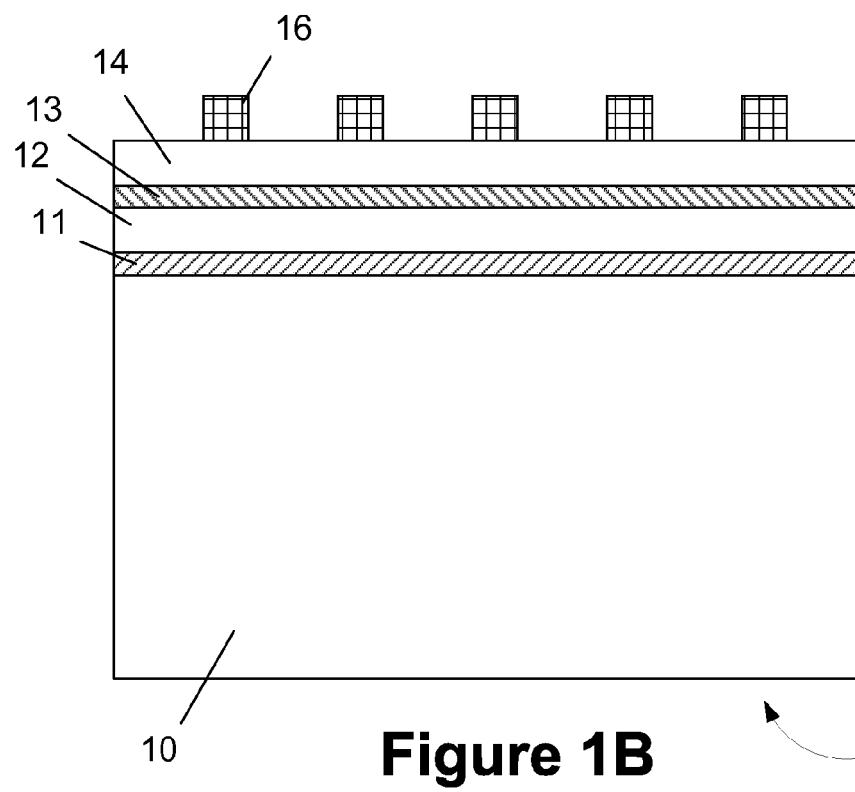

FIG. 1B depicts the device 100 after a patterned mask layer 16, such as a patterned hard mask layer, has been formed above the various layers of semiconducting material 11, 12, 13, 14 using known photolithography and etching techniques. The patterned mask layer 16 is intended to be representative in nature as it could be comprised of a variety of materials, such as, for example, a photoresist material, silicon nitride, silicon oxynitride, silicon dioxide, etc. Moreover, the patterned mask layer 16 could be comprised of multiple layers of material, such as, for example, a pad oxide layer (not shown) that is formed on the substrate 10 and a silicon nitride layer (not shown) that is formed on the pad oxide layer. Thus, the particular form and composition of the patterned mask layer 16 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 16 is a hard mask layer of silicon nitride that is initially formed by performing a CVD process and thereafter patterned using known sidewall image transfer techniques and/or photolithographic techniques combined with performing known etching techniques.

Figure 1C:
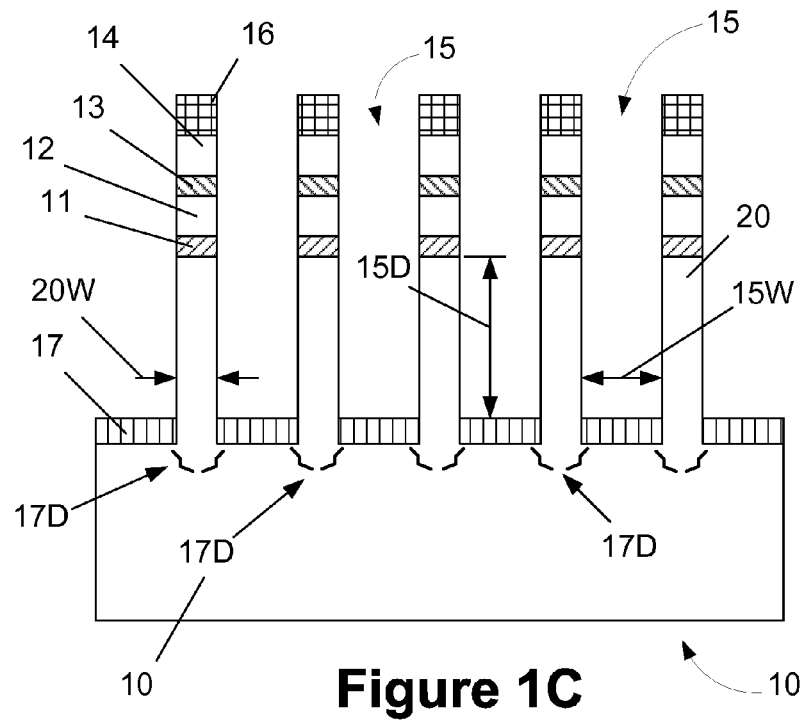

Next, as shown in FIG. 1C, multiple etching processes, such as a plurality of dry or wet etching processes, are performed on the material layers 11-14 and on the substrate 10 through the patterned mask layer 16 to form a plurality of trenches 15. This etching process results in the definition of a plurality of original fin structures 20. The overall size, shape and configuration of the trenches 15 and the original fin structures 20 may vary depending on the particular application. The depth 15D and width 15W of the trenches 15 may vary depending upon the particular application. In one illustrative embodiment, based on current day technology, the depth 15D of the trenches 15 may range from approximately 100-350 nm and the width 15W of the trenches 15 may range from about 15-80 nm. In some embodiments, the original fin structure 20 may have a width 20W within the range of about 10-30 nm. In the illustrative example depicted in the attached figures, the trenches 15 and the original fin structures 20 are all of a uniform size and shape. However, as discussed more fully below, such uniformity in the size and shape of the trenches 15 and the original fin structures 20 is not required to practice at least some aspects of the inventions disclosed herein. In the example depicted herein, the trenches 15 are formed by performing a plurality of anisotropic etching processes that result in the trenches 15 having a schematically depicted, generally rectangular configuration. In an actual real-world device, the sidewalls of the trenches 15 may be somewhat inwardly tapered, although that configuration is not depicted in the drawings. In some cases, the trenches 15 may have a reentrant profile near the bottom of the trenches 15. To the extent the trenches 15 are formed by performing a wet etching process, the trenches 15 may tend to have a more rounded configuration or non-linear configuration as compared to the generally rectangular configuration of the trenches 15 that are formed by performing an anisotropic etching process. Thus, the size and configuration of the trenches 15, and the manner in which they are made, should not be considered a limitation of the present invention. For ease of disclosure, only the substantially rectangular trenches 15 will be depicted in subsequent drawings.

With continuing reference to FIG. 1C, in one embodiment disclosed herein, an ion implant process may be performed to form implant regions 17 in the substrate 10 proximate the bottom of the trenches 15. The ion implant process is performed using relatively large atoms, such as, for example, xenon, germanium, argon, etc. In one illustrative embodiment, the implant regions 17 may be performed using any of the above dopant species at a dopant dose of about $3e^{15}$ ions/cm$^2$ and at an energy level of about 2-10 keV. In this illustrative example, the implant regions 17 have a target depth of about 20-30 nm. Ultimately, as a result of the heating of the device 100 as processing continues after the implant regions 17 are initially formed, the relatively large atoms in the implant regions 17 will tend to migrate and induce schematically depicted defects 17D in the substrate 10. If desired, a separate dedicated heating step may be performed at some point in the process flow to insure the formation of the defects 17D. The defects 17D are depicted in FIG. 1C for purposes of explanation only as they may not be formed at this point in the illustrative process flow described herein. The defects 17D tend to de-couple the fins 20 from the remaining portions of the substrate 10, or at least make the connection between the fins 20 and the substrate 10 less rigid, thereby permitting more effective stress engineering of the channel region of the device 100, as described more fully below. The implant regions 17 need not be formed in all embodiments of the various inventions disclosed herein.

Figure 1D:
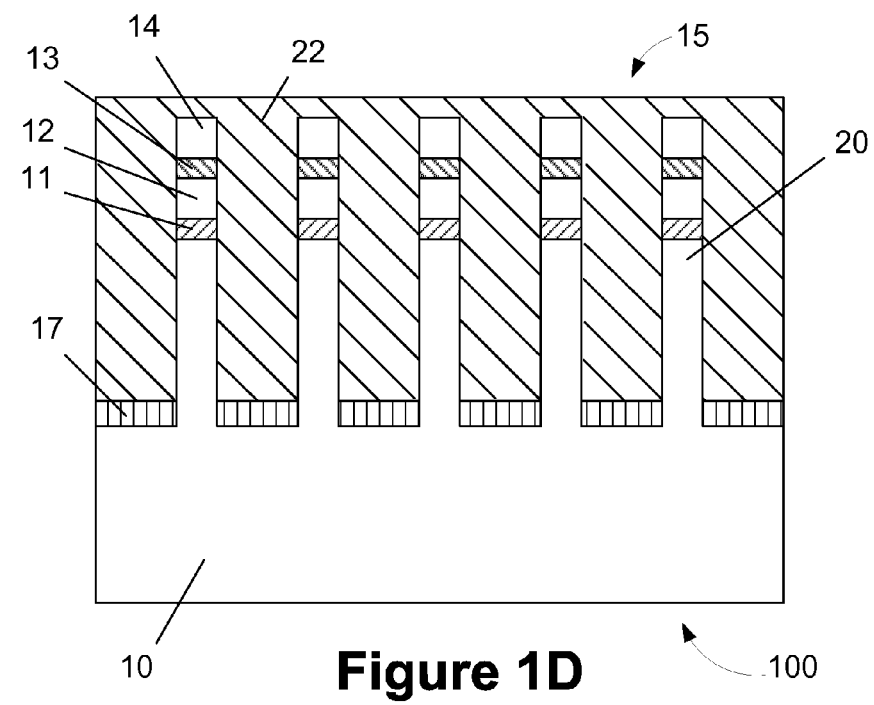

Then, as shown in FIG. 1D, a stress-inducing material 22 is formed in the trenches 15 of the device 100. In the depicted example, the hard mask layer 16 was removed prior to the formation of the stress-inducing material 22, but that may not be the case in all applications. Due to the configuration of FinFET devices as compared to planar FET devices, to establish a desired compressive stress in the channel region of a P-FinFET device, the stress-inducing material 22 formed in the trenches 15 for such a P-FinFET device should be formed with an appropriate tensile stress. Conversely, to establish a desired tensile stress in the channel region of an N-FinFET device, the stress-inducing material 22 formed in the trenches 15 for such an N-FinFET device should be formed with an appropriate compressive stress. The absolute value of the compressive stress or tensile stress for the stress-inducing material 22 will vary depending upon the particular application, e.g., it may fall within the range of about 0.1-2 GPa. The stressed layer of material 22 may be comprised of a variety of different materials, such as, for example, silicon nitride, hafnium silicate, etc., and it may be formed by performing a variety of techniques, e.g., CVD, ALD, etc. In one illustrative embodiment, the stressed layer of material 22 may be a layer of silicon nitride that is formed by performing a CVD process. In one illustrative example where the device is an N-FinFET device, the stress-inducing material 22 is formed such that it generates a tensile stress in the direction that is approximately perpendicular to the long axis of the fins 20, i.e., it generates a tensile stress in a direction that is normal to the drawing plane of FIG. 1D. In one illustrative example where the device 100 is a P-FinFET device, the stress-inducing material 22 is formed such that it generates a compressive stress in what will become the channel region of the device in a direction that is approximately perpendicular to the long axis of the fins 20, i.e., it generates a compressive stress in a direction that is normal to the drawing plane of FIG. 1D. The manner in which such a stress-inducing material 22 may be formed so as to impart the desired stress is well known to those skilled in the art. Such a stress-inducing material 22 may have the desired stress level directly as a result of the process of formation (intrinsic stress) or as a result of stress being thermally induced (a material deposited typically at an elevated temperature, having a thermal expansion coefficient substantially different from that of the substrate), or a combination of intrinsic and thermally-induced stress.

Figure 1E:
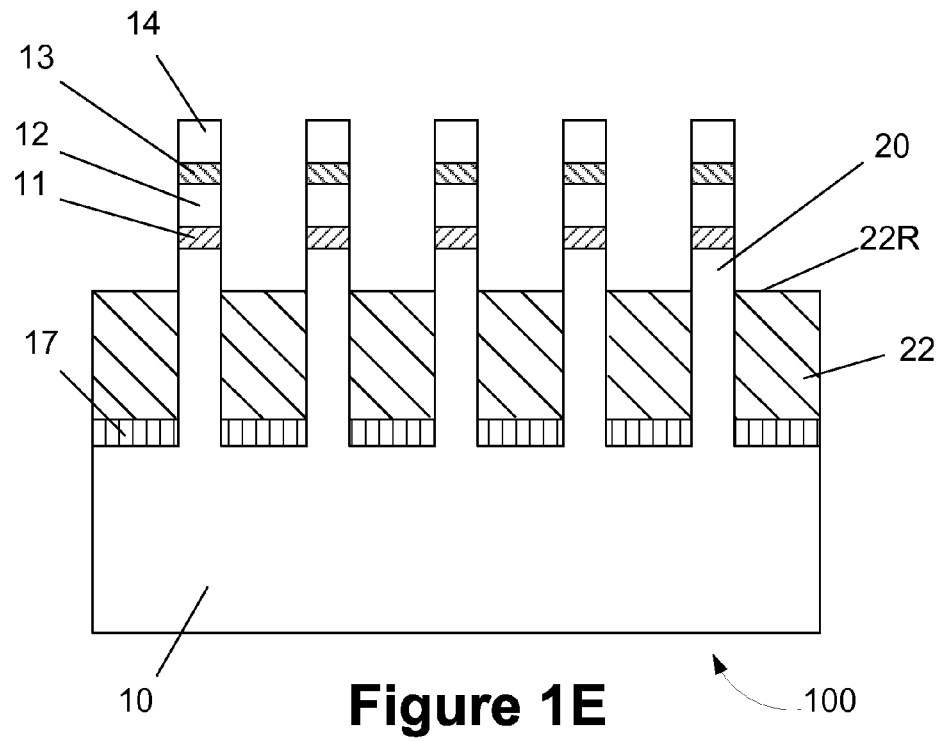

FIG. 1E depicts the device 100 after a chemical mechanical polishing (CMP) process has been performed on the stress-inducing material 22, and after one or more etching processes are performed on the stress-inducing material 22 to reduce its overall thickness and thereby define a reduced thickness stress-inducing material 22R. The etching process may be either a wet or dry etching process. The final thickness of the reduced thickness stress-inducing material 22R may vary depending upon the particular application, e.g., it may have a reduced thickness of about 20-200 nm.

Figure 1F:
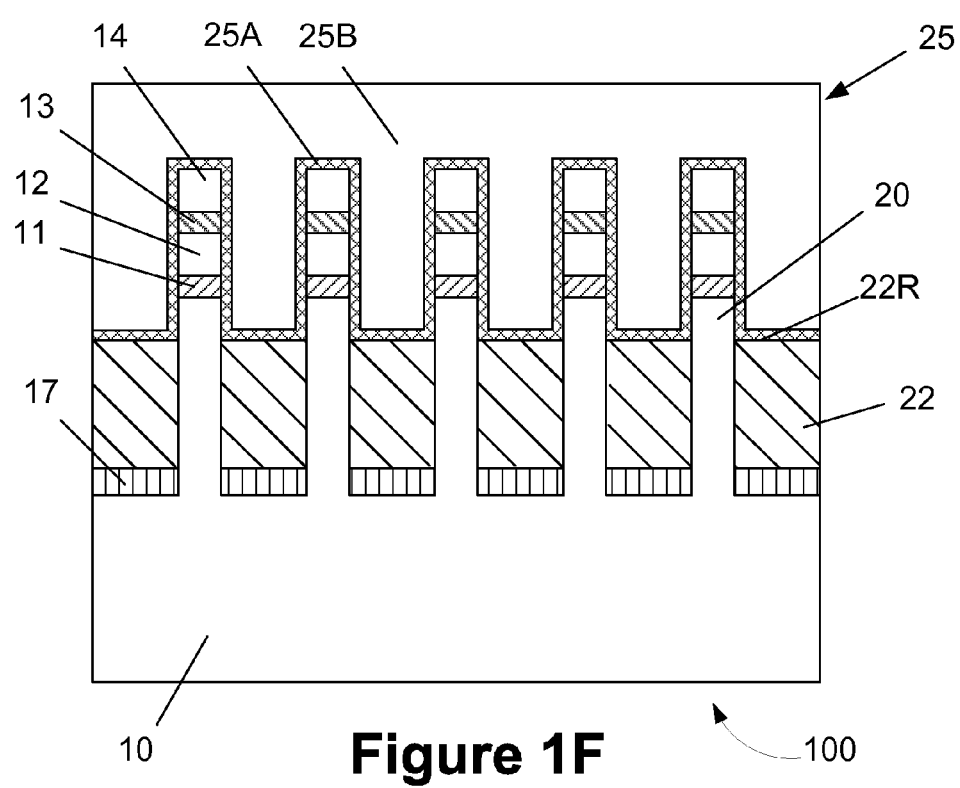
Figure 1G:
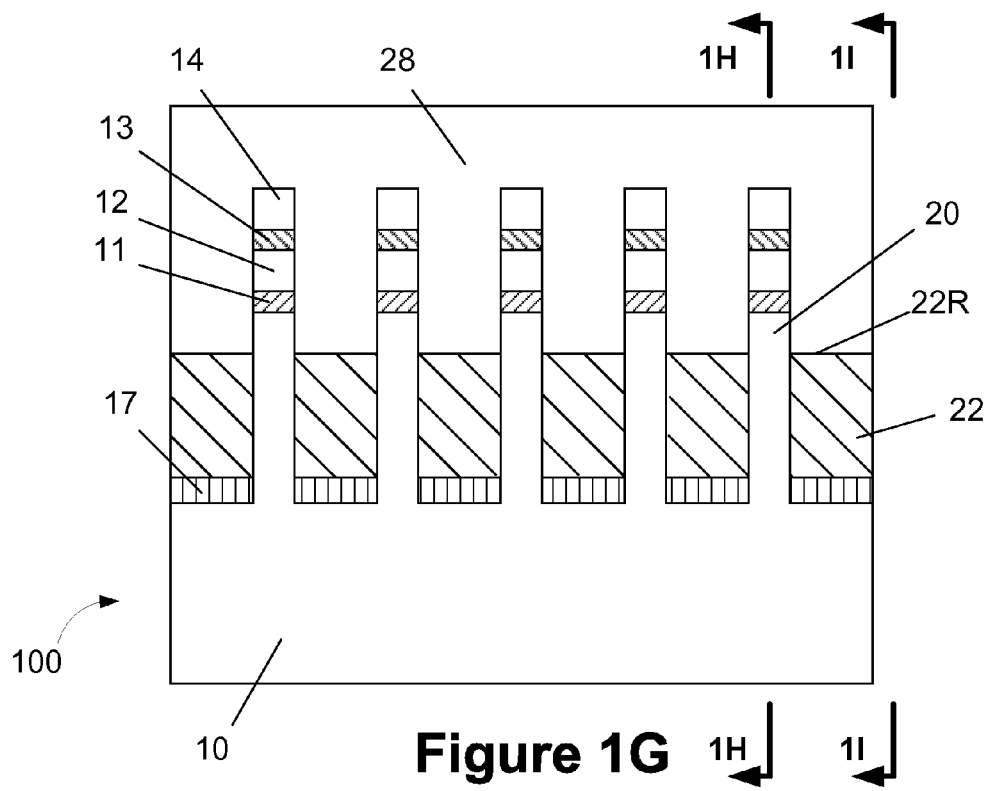
Figure 1H:
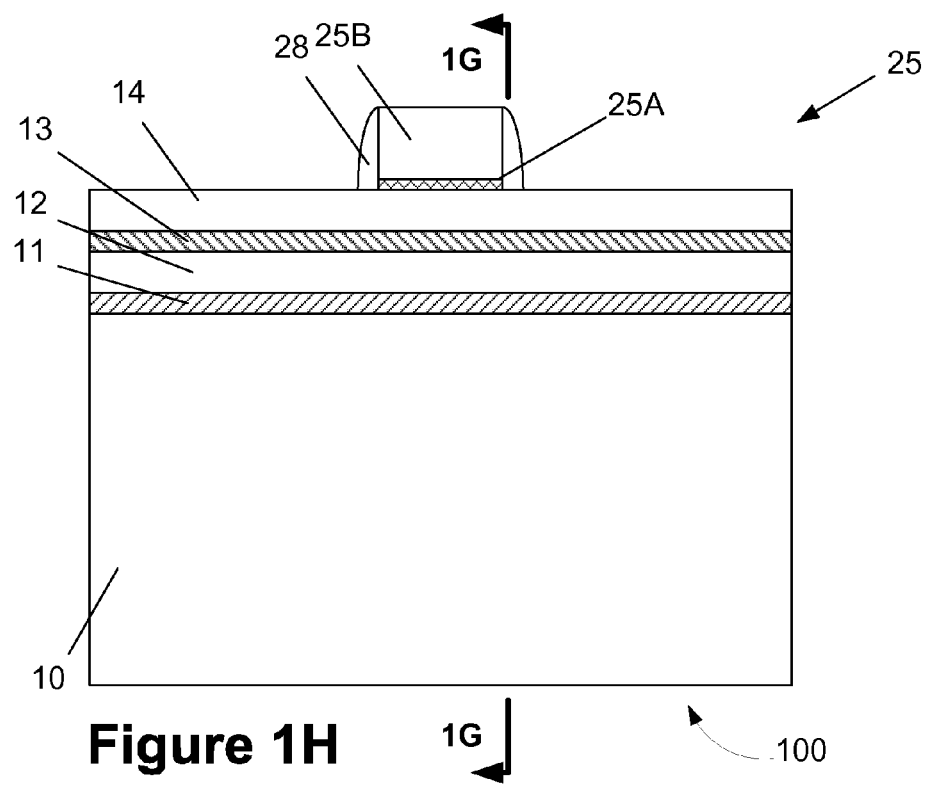
Figure 1I:
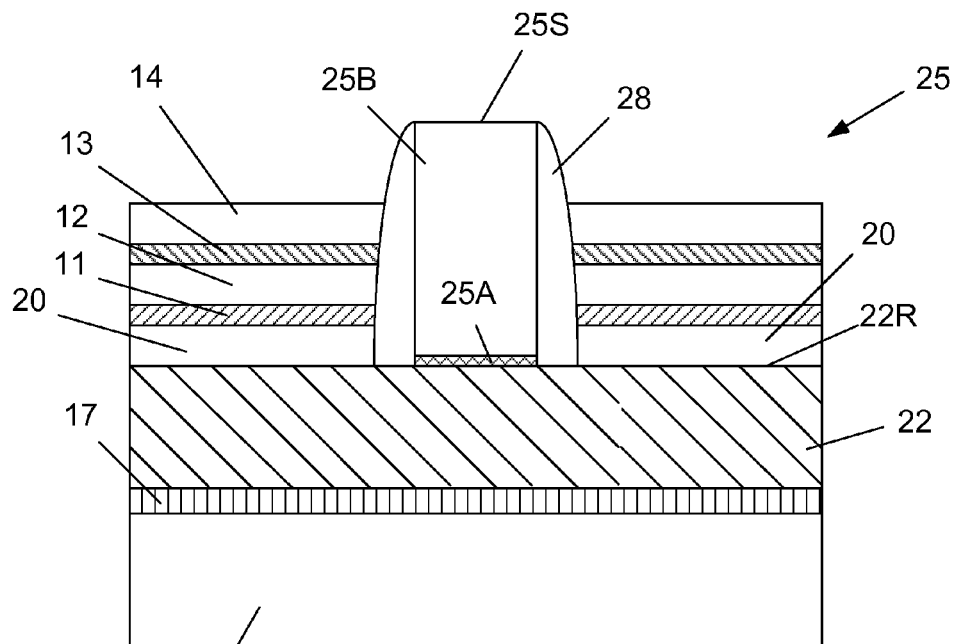

Next, as shown in FIGS. 1F-1I, a sacrificial gate structure 25 is formed on the device 100 using well-known techniques. FIGS. 1F and 1G are cross-sectional views of the device 100 taken through the sacrificial gate structure 25 and one of the spacers, respectively, in a direction that is transverse to the long axis of the fins 20. FIGS. 1H and 1I are views taken as indicated in FIG. 1G in a direction that is parallel to the long axis of the fins 20. In one illustrative embodiment, the schematically depicted sacrificial gate structure 25 includes an illustrative gate insulation layer 25A and an illustrative gate electrode 25B. An illustrative gate cap layer (not shown) may also be formed above the illustrative gate electrode 25B. The gate insulation layer 25A may be comprised of a variety of different materials, such as, for example, silicon dioxide. Similarly, the gate electrode 25B may also be of a variety of materials such as polysilicon or amorphous silicon. As will be recognized by those skilled in the art after a complete reading of the present application, the sacrificial gate structure 25 of the device 100 depicted in the drawings, i.e., the gate insulation layer 25A and the gate electrode 25B, is intended to be representative in nature. That is, the sacrificial gate structure 25 may be comprised of a variety of different materials and it may have a variety of configurations. In one illustrative embodiment, a deposition process may be performed to form a gate insulation layer 25A comprised of silicon dioxide. Thereafter, the gate electrode material 25B and the gate cap layer material (not shown) may be deposited above the device 100 and the layers may be patterned using known photolithographic and etching techniques. Thereafter, as shown in FIGS. 1G-1H, sidewall spacers 28 comprised of, for example, silicon nitride, are formed adjacent the sacrificial gate structure 25. The spacers 28 may be formed by depositing a layer of spacer material and thereafter performing an anisotropic etching process to define the spacers 28 using known techniques. After the spacers 28 are formed, if desired, an epitaxial growth process may be performed to form additional semiconducting material (not shown) on the portions of the fins 20, and the various layers of semiconducting material 11, 12, 13 and 14, positioned outside of the spacers 28.

Figure 1J:
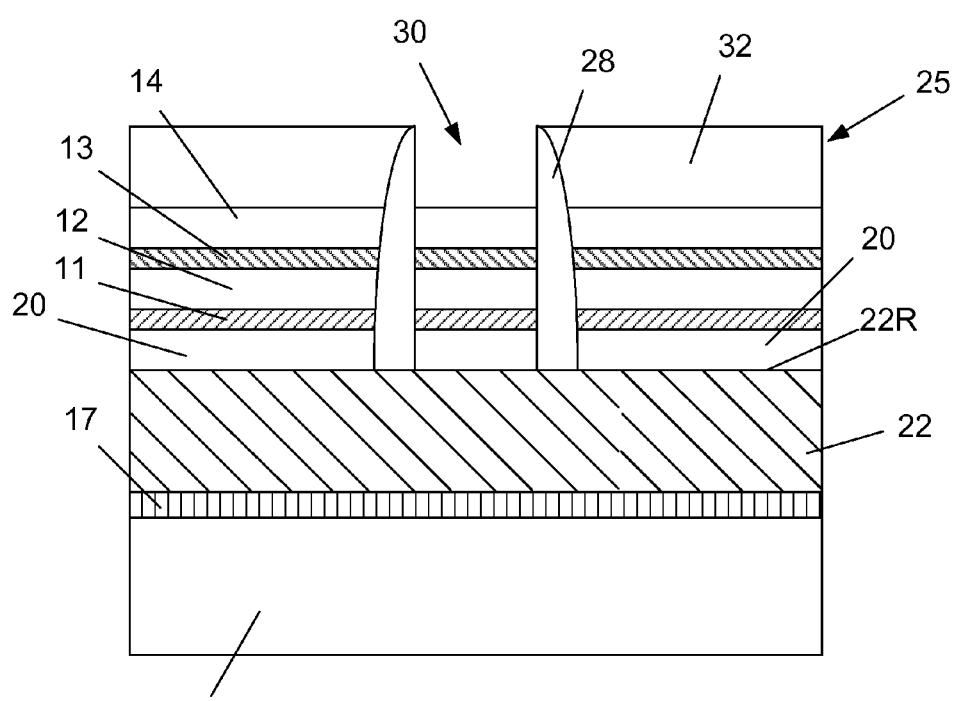

FIG. 1J depicts the device 100 after several process operations have been performed to form a dielectric layer 32, e.g., silicon dioxide, on the device. Initially, the dielectric layer 32 was blanket deposited across the device and a CMP process was performed to planarize the upper surface of the dielectric layer 32 with the upper surface 25S (see FIG. 1I) of the sacrificial gate electrode 25B. Thereafter, one or more etching processes were performed to remove the sacrificial gate structure 25 and thereby define a gate cavity 30 between the spacers 28 and thereby expose the portions of the semiconducting materials 11, 12, 13 and 14 that are positioned within the gate cavity 30.

Figure 1K:
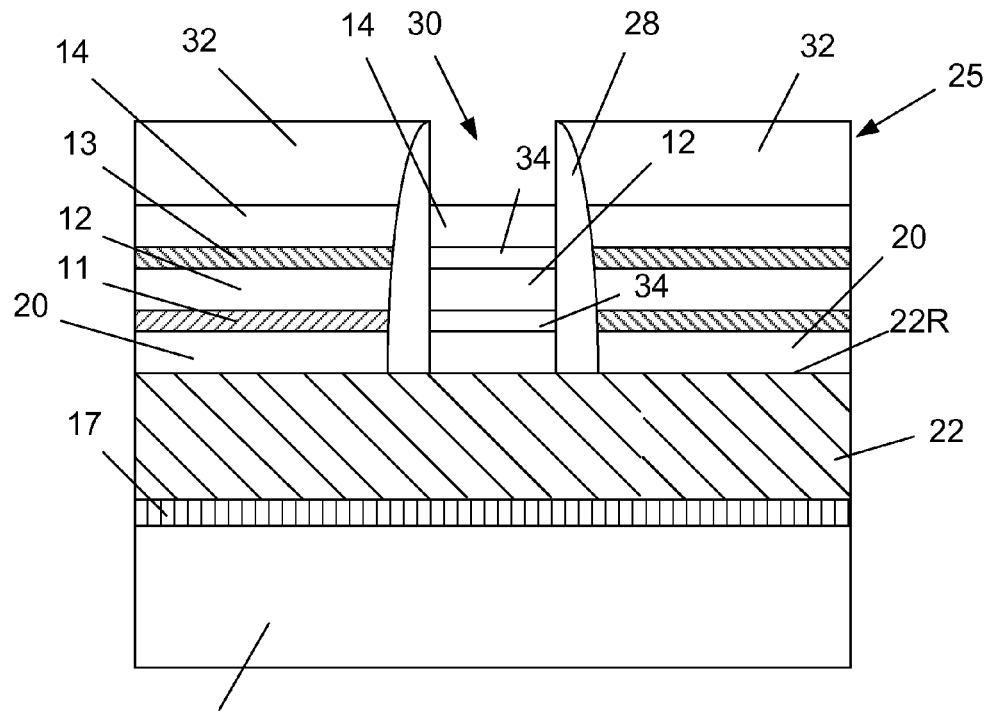
Figure 2:
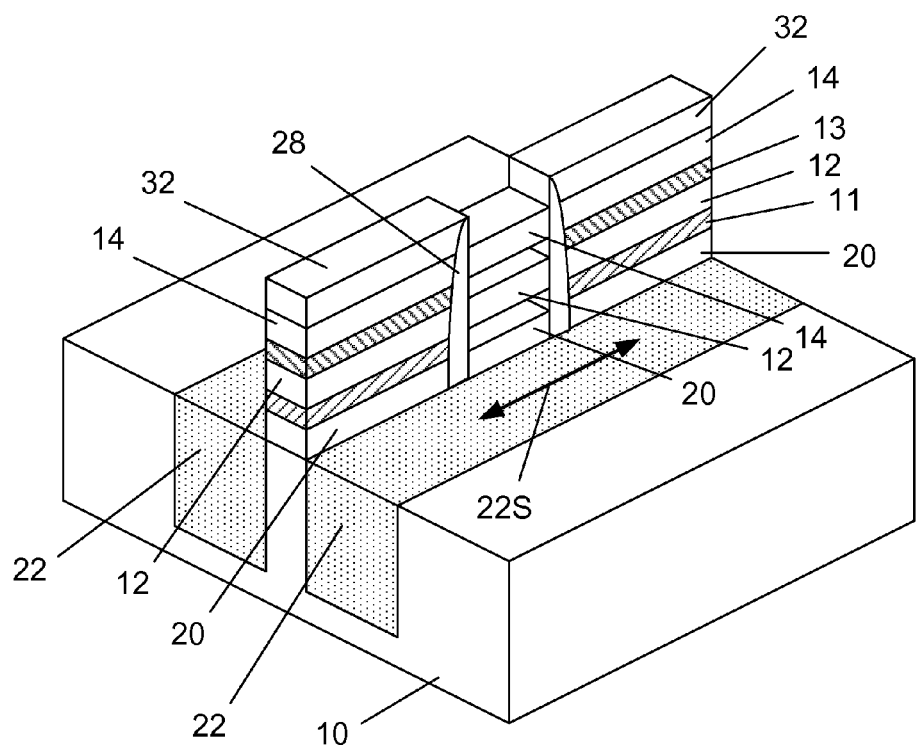
FIG. 2 is a perspective view of one illustrative embodiment of a device disclosed herein at a point during the fabrication process.

Next, as shown in FIG. 1K, one or more etching processes, such as wet etching processes, are performed to selectively remove the semiconducting materials 11 and 13 relative to the semiconducting materials 12 and 14 within the gate cavity 30. These process operations result in the formation of gaps 34 between the semiconducting material layers 12 and 14 in the channel region of the device. In the case where the semiconducting material layers 11 and 13 are made of the same semiconducting material, only a single etching process may be performed to arrive at the structure depicted in FIG. 1K. FIG. 2 is a perspective view of the device at the point of fabrication reflected in FIG. 1K. Note that the layers 11 and 13 are removed in the channel region of the device, in the region between the spacers 28. Also note that the stress-inducing material 22 may induce the desired stress (tensile or compressive) on the fins in the direction generally indicated by the double arrow labeled 22S in FIG. 2. For simplicity, the semiconductor materials 14, 12 and 20 depicted in the drawings after the etch process has been performed are depicted as having sharp, square corners. However, if desired, the semiconductor materials 14, 12 and 20 may have a more rounded configuration. Such rounding may be accomplished by virtue of the nature and/or parameters of the etch process performed to remove the material layers 11, 13 or by performing an additional process, such as a hydrogen anneal process, to reflow the semiconductor layers 14, 12, 20 to make them have an approximate cylinder-like shape or nanowire configuration.

Figure 1L:
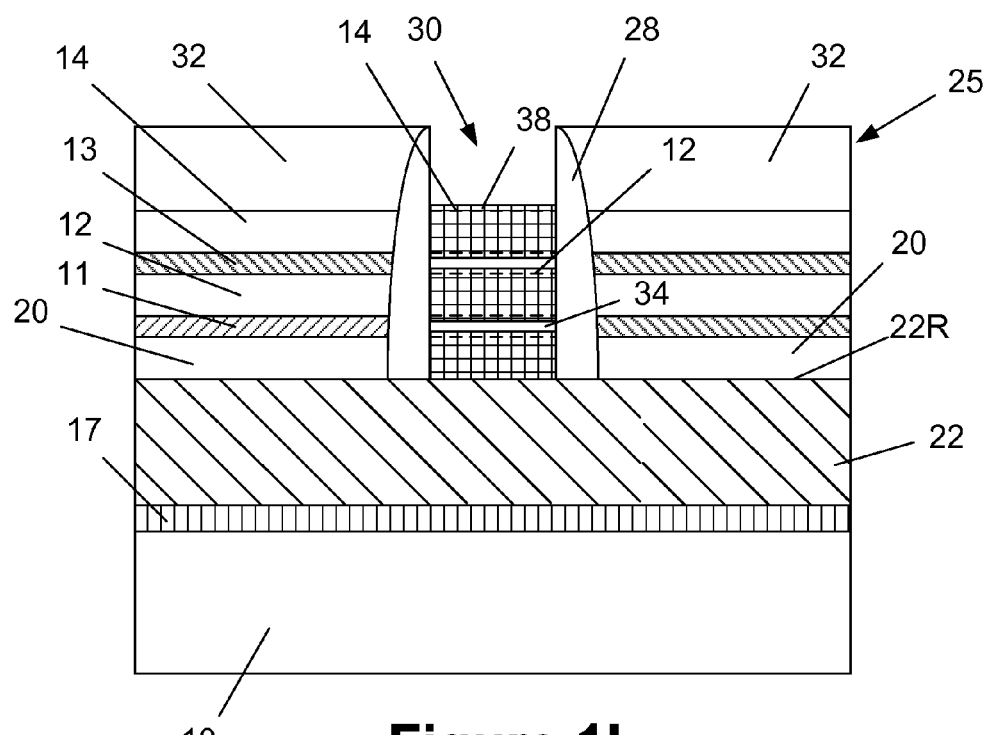

At this point in the process flow, a final gate structure for the device 100 is formed around the exposed nanowires 12, 14 within the gate cavity 30. Again, the exposed nanowires 12, 14, 20 are depicted as having generally rectangular cross-sectional configuration for simplicity. As noted above, the exposed nanowires 12, 14, 20 may have a more rounded configuration. FIGS. 1L-N are provided to explain various aspects of this process as it relates to the formation of a final gate insulation layer 38 for the device. FIG. 1M is an enlarged view of the gate region of the device 100 taken along the long axis of the fin 20, while FIG. 1N is a cross-sectional view of the gate region taken as indicated in FIG. 1M. As shown in these drawings, a final gate insulation layer 38 may be formed on and around the exposed nanowires 12, 14 within gate cavity 30 by performing, for example, a CVD process. The nanowires 12, 14 are depicted with dashed lines in FIG. 1L. The final gate insulation layer 38 may be comprised of a variety of different materials, such as, for example, a so-called high-k (k greater than 10) insulation material (where k is the relative dielectric constant), etc. The thickness of the gate insulation layer 38 may also vary depending upon the particular application, e.g., it may have a thickness of about 1-2 nm. In some applications, the thickness of the gate insulation layer 38 is such that it does not completely fill the gap 34 between the nanowires 12, 14, as depicted in FIGS. 1L-1N, while in other cases, the gate insulation layer 38 does fill substantially all of such gaps 34.

FIGS. 1O-Q are provided to explain various aspects of this process as it relates to the formation of a final gate electrode structure 40 for the device. FIG. 1P is an enlarged view of the gate region of the device 100 taken along the long axis of the fin 20, while FIG. 1Q is a cross-sectional view of the gate region taken as indicated in FIG. 1P. The final gate electrode 40 may also be of one or more conductive materials, such as polysilicon or amorphous silicon, or it may be comprised of one or more metal layers that act as the gate electrode 40. As will be recognized by those skilled in the art after a complete reading of the present application, the final gate structure of the device 100 depicted in the drawings, i.e., the gate insulation layer 38 and the gate electrode 40, is intended to be representative in nature. In one illustrative embodiment, a conformal CVD or ALD process may be performed to form a gate insulation layer 38 comprised of hafnium oxide in the gate cavity 30. Thereafter, one or more metal layers (that will become the gate electrode 40) and a gate cap layer material (not shown), e.g., silicon nitride, may be deposited above the device 100 and in the cavity 30. Thereafter, one or more CMP processes may be performed to remove excess portions of the gate insulation layer 38 and the materials that comprise the gate electrode 40 that are positioned outside of the gate cavity 30. In the depicted example, the material(s) of the gate electrode 40 completely fill the gaps 34 between the nanowires 12, 14. At this point, traditional manufacturing techniques may be performed to complete the manufacture of the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a FinFET device comprising a channel region and a plurality of source/drain regions, the method comprising:
    forming a plurality of spaced-apart trenches that extend at least partially into a semiconducting substrate, said trenches defining a fin structure for said device comprised of first and second layers of semiconducting material, wherein said first layer of semiconducting material is selectively etchable relative to said semiconducting substrate and said second layer of semiconducting material, said fin structure extending in a gate-length direction across what will become said channel region and said source/drain regions for said device;
    forming a sacrificial gate structure above a portion of said fin structure corresponding to said channel region for said FinFET device, said sacrificial gate structure being comprised of a sacrificial gate insulation layer and a sacrificial gate electrode;
    forming at least one sidewall spacer adjacent said sacrificial gate structure;
    performing at least one etching process to remove said sacrificial gate structure and thereby define a gate cavity;
    while masking portions of said fin structure positioned outside of said at least one spacer, performing at least one selective etching process to selectively remove said first layer of semiconducting material relative to said second layer of semiconducting material within said gate cavity and thereby define a space between said second semiconducting material and said semiconducting substrate within said channel region of said device; and
    forming a final gate structure in said gate cavity.

2. The method of claim 1, wherein said semiconducting substrate and said second layer of semiconducting material are silicon and said first layer of semiconducting material is silicon/germanium.

3. The method of claim 1, wherein said semiconducting substrate and said second layer of semiconducting material are comprised of the same material.

4. The method of claim 3, wherein said final gate structure comprises a gate insulation layer comprised of a high-k insulating material and a gate electrode comprised of at least one layer of metal.

5. The method of claim 3, wherein said gate insulation layer is positioned on the entire exterior surface of said second layer of semiconducting material within said gate cavity.

6. The method of claim 5, wherein said gate electrode is positioned around the entire perimeter of said second layer of semiconducting material within said gate cavity.

7. The method of claim 1, wherein, prior to forming said sacrificial gate structure, performing an ion implant process to define an implant region comprised of one of germanium, argon or xenon in said semiconducting substrate proximate a bottom of said trenches.

8. The method of claim 7, wherein, prior to forming said sacrificial gate structure, forming a stress-inducing material in said trenches so as to induce a stress on said fin structure.

9. The method of claim 8, wherein said induced stress is one of a tensile stress or a compressive stress.

10. The method of claim 1, wherein, prior to forming said sacrificial gate structure, forming a stress-inducing material in said trenches so as to induce a stress on said fin structure.

11. The method of claim 10, wherein said induced stress is one of a tensile stress or a compressive stress.

12. A method of forming a FinFET device comprising a channel region and a plurality of source/drain regions, the method comprising:
    forming a layer of silicon/germanium on a semiconducting substrate comprised of silicon;
    forming a layer of silicon on said layer of silicon/germanium;
    performing at least one etching process to form a plurality of spaced-apart trenches, said trenches defining a fin structure for said device comprised of said semiconducting substrate, said layer of silicon/germanium formed above said semiconducting substrate and said layer of silicon, said fin structure extending in a gate-length direction across what will become said channel region and said source/drain regions for said device;
    forming a sacrificial gate structure above a portion of said fin structure corresponding to said channel region for said FinFET device, said sacrificial gate structure being comprised of a sacrificial gate insulation layer and a sacrificial gate electrode;
    forming at least one sidewall spacer adjacent said sacrificial gate structure;
    performing at least one etching process to remove said sacrificial gate structure and thereby define a gate cavity;
    while masking portions of said fin structure positioned outside of said at least one spacer, performing at least one selective etching process to selectively remove said layer of silicon/germanium relative to said layer of silicon within said gate cavity and thereby define a space between said layer of silicon and said semiconducting substrate within said channel region of said device; and
    forming a final gate structure in said gate cavity, said final gate structure being comprised of a high-k gate insulation layer and a gate electrode comprised of at least one metal.

13. The method of claim 12, wherein said final gate structure comprises a gate insulation layer comprised of a high-k insulating material and a gate electrode comprised of at least one layer of metal.

14. The method of claim 12, wherein said gate insulation layer is positioned on the entire exterior surface of said layer of silicon within said gate cavity.

15. The method of claim 12, wherein at least a portion of said gate electrode is positioned around the entire perimeter of said layer of silicon within said gate cavity.

16. The method of claim 12, wherein, prior to forming said sacrificial gate structure, performing an ion implant process to define an implant region comprised of one of germanium, argon or xenon in said semiconducting substrate proximate a bottom of said trenches.

17. The method of claim 12, wherein, prior to forming said sacrificial gate structure, forming a stress-inducing material in said trenches so as to induce a stress on said fin structure.

18. The method of claim 17, wherein said induced stress is one of a tensile stress or a compressive stress.

19. A method of forming a FinFET device comprising a channel region and a plurality of source/drain regions, the method comprising:
- forming a layer of silicon/germanium on a semiconducting substrate comprised of silicon;
- forming a layer of silicon on said layer of silicon/germanium;
- performing at least one etching process to form a plurality of spaced-apart trenches, said trenches defining a fin structure for said device comprised of said semiconducting substrate, said layer of silicon/germanium formed above said semiconducting substrate and said layer of silicon, said fin structure extending in a gate-length direction across what will become said channel region and said source/drain regions for said device;
- forming a sacrificial gate structure above a portion of said fin structure corresponding to said channel region for said FinFET device, said sacrificial gate structure being comprised of a sacrificial gate insulation layer and a sacrificial gate electrode;
- forming at least one sidewall spacer adjacent said sacrificial gate structure;
- performing at least one etching process to remove said sacrificial gate structure and thereby define a gate cavity;
- while masking portions of said fin structure positioned outside of said at least one spacer, performing at least one selective etching process to selectively remove said layer of silicon/germanium relative to said layer of silicon within said gate cavity and thereby define a space between said layer of silicon and said semiconducting substrate within said channel region of said device;
- forming a high-k gate insulation layer around an entire exterior surface of said layer of silicon within said gate cavity; and
- forming a gate electrode comprised of a metal on an entire exterior surface of said high-k gate insulation layer.

20. The method of claim 19, wherein, prior to forming said sacrificial gate structure, performing an ion implant process to define an implant region comprised of one of germanium, argon or xenon in said semiconducting substrate proximate a bottom of said trenches.

21. The method of claim 20, wherein, prior to forming said sacrificial gate structure, forming a stress-inducing material in said trenches so as to induce a stress on said fin structure.

22. The method of claim 19, wherein, prior to forming said sacrificial gate structure, forming a stress-inducing material in said trenches so as to induce a stress on said fin structure.

23. A method of forming a device, comprising:
- forming a plurality of spaced-apart trenches that extend at least partially into a semiconducting substrate, said trenches defining a fin structure for said device comprised of first and second layers of semiconducting material, wherein said first layer of semiconducting material is selectively etchable relative to said semiconducting substrate and said second layer of semiconducting material;
- forming a stress-inducing material in said trenches so as to induce a stress on said fin structure;
- after forming said stress-inducing material in said trenches, forming a sacrificial gate structure above said fin structure, said sacrificial gate structure being comprised of a sacrificial gate insulation layer and a sacrificial gate electrode;
- forming at least one sidewall spacer adjacent said sacrificial gate structure;
- performing at least one etching process to remove said sacrificial gate structure and thereby define a gate cavity;
- performing at least one selective etching process to selectively remove said first layer of semiconducting material relative to said second layer of semiconducting material within said gate cavity and thereby define a space between said second semiconducting material and said semiconducting substrate; and
- forming a final gate structure in said gate cavity.

24. The method of claim 23, wherein said induced stress is one of a tensile stress or a compressive stress.

* * * * *